(12) United States Patent
Varshney et al.

(10) Patent No.: US 12,525,985 B2
(45) Date of Patent: Jan. 13, 2026

(54) CALIBRATION SCHEME FOR A NON-LINEAR ADC

(71) Applicant: Texas Instruments Incorporated, Dallas, TX (US)

(72) Inventors: Himanshu Varshney, Bengaluru (IN); Viswanathan Nagarajan, Bengaluru (IN); Charls Babu, Bengaluru (IN); Narasimhan Rajagopal, Bengaluru (IN); Eeshan Miglani, Bengaluru (IN); Visvesvaraya A. Pentakota, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/440,113

(22) Filed: Feb. 13, 2024

(65) Prior Publication Data

US 2024/0187013 A1    Jun. 6, 2024

Related U.S. Application Data

(63) Continuation of application No. 17/568,972, filed on Jan. 5, 2022, now Pat. No. 11,962,318.

(30) Foreign Application Priority Data

Jan. 12, 2021    (IN) .............................. 202141001383

(51) Int. Cl.
  *H03M 1/10*      (2006.01)
  *H03M 1/00*      (2006.01)
  (Continued)

(52) U.S. Cl.
  CPC .......... *H03M 1/1009* (2013.01); *H03M 1/002* (2013.01); *H03M 1/06* (2013.01); *H03M 1/10* (2013.01); *H03M 1/12* (2013.01)

(58) Field of Classification Search
  CPC ...... H03M 1/1009; H03M 1/12; H03M 1/002; H03M 1/06
  See application file for complete search history.

(56) References Cited

U.S. PATENT DOCUMENTS

| | | |
|---|---|---|
| 4,612,533 A | 9/1986 | Evans |
| 4,899,071 A | 2/1990 | Morales |
| (Continued) | | |

FOREIGN PATENT DOCUMENTS

| | | |
|---|---|---|
| CN | 111064468 A | 4/2020 |
| EP | 3716486 A1 | 9/2020 |
| (Continued) | | |

OTHER PUBLICATIONS

Extended European Search report for corresponding EP Application No. 21911890.8, dated Jan. 31, 2024 (19 pages).

(Continued)

*Primary Examiner* — Joseph J Lauture
(74) *Attorney, Agent, or Firm* — Mandy Barsilai Fernandez; Frank D. Cimino

(57) ABSTRACT

In described examples, an analog to digital converter (ADC), having an input operable to receive an analog signal and an output operable to output a digital representation of the analog signal, includes a voltage to delay (VD) block. The VD block is coupled to the input of the ADC and generates a delay signal responsive to a calibration signal. A backend ADC is coupled to the VD block, and receives the delay signal. The backend ADC having multiple stages including a first stage. A calibration engine is coupled to the multiple stages and the VD block. The calibration engine measures an error count of the first stage and stores a delay value of the first stage for which the error count is minimum.

22 Claims, 8 Drawing Sheets

(51) Int. Cl.
*H03M 1/06* (2006.01)
*H03M 1/12* (2006.01)

(56) References Cited

U.S. PATENT DOCUMENTS

| | | | |
|---|---|---|---|
| 4,928,103 A | 5/1990 | Lane | |
| 5,317,721 A | 5/1994 | Robinson | |
| 5,495,247 A | 2/1996 | Yamamoto et al. | |
| 5,563,533 A | 10/1996 | Cave et al. | |
| 5,821,780 A | 10/1998 | Hasegawa | |
| 6,002,352 A | 12/1999 | El-Ghoroury et al. | |
| 6,046,612 A | 4/2000 | Taft | |
| 6,060,912 A | 5/2000 | Opris et al. | |
| 6,069,579 A | 5/2000 | Ito et al. | |
| 6,124,746 A | 9/2000 | Van Zalinge | |
| 6,144,231 A | 11/2000 | Goldblatt | |
| 6,314,149 B1 | 11/2001 | Daffron | |
| 6,377,200 B1 | 4/2002 | Lee | |
| 6,556,060 B1 | 4/2003 | Dillon et al. | |
| 6,590,517 B1 | 7/2003 | Swanson | |
| 6,720,895 B2 | 4/2004 | Poulton et al. | |
| 6,822,596 B2 | 11/2004 | Theiler | |
| 6,836,127 B2 | 12/2004 | Marshall | |
| 6,857,002 B1 | 2/2005 | Thomsen | |
| 7,046,179 B1 | 5/2006 | Taft et al. | |
| 7,142,138 B2 | 11/2006 | Chen et al. | |
| 7,233,172 B2 | 6/2007 | Kanamori et al. | |
| 7,262,724 B2 | 8/2007 | Hughes et al. | |
| 7,379,007 B2 | 5/2008 | Noguchi | |
| 7,379,010 B2 | 5/2008 | Tero | |
| 7,405,689 B2 | 7/2008 | Kernahan et al. | |
| 7,446,573 B1 | 11/2008 | Miller | |
| 7,501,862 B2 | 3/2009 | Su et al. | |
| 7,525,471 B2 | 4/2009 | Prodic et al. | |
| 7,557,746 B1 | 7/2009 | Waltari | |
| 7,737,875 B2 | 6/2010 | Waltari et al. | |
| 7,738,265 B2 | 6/2010 | Trattler | |
| 7,839,323 B2 | 11/2010 | Kidambi | |
| 7,847,576 B2 | 12/2010 | Koiima | |
| 7,884,748 B2 | 2/2011 | Dekagbes | |
| 7,916,064 B2 | 3/2011 | Lin et al. | |
| 7,919,994 B2 | 4/2011 | Walker | |
| 8,089,388 B2 | 1/2012 | Cui et al. | |
| 8,130,130 B2 | 3/2012 | Danjo et al. | |
| 8,183,903 B2 | 5/2012 | Glass et al. | |
| 8,373,444 B2 | 2/2013 | Lee et al. | |
| 8,421,664 B2 | 4/2013 | Ryu et al. | |
| 8,514,121 B1 | 8/2013 | Shu | |
| 8,558,725 B2 | 10/2013 | Kidambi | |
| 8,773,169 B2 | 7/2014 | Dinc et al. | |
| 8,810,282 B2 | 8/2014 | Li | |
| 8,836,375 B2 | 9/2014 | Ghatak | |
| 8,896,476 B2 | 11/2014 | Harpe | |
| 9,350,374 B2 | 5/2016 | Sundblad et al. | |
| 9,369,137 B2 | 6/2016 | Masuko | |
| 9,379,007 B2 | 6/2016 | Arvin | |
| 9,455,695 B2 | 9/2016 | Kull et al. | |
| 9,467,160 B2 | 10/2016 | Chang | |
| 9,503,116 B2 | 11/2016 | Speir et al. | |
| 9,548,752 B1 | 1/2017 | Shrivastava et al. | |
| 9,559,716 B1 | 1/2017 | Matsui et al. | |
| 9,685,971 B2 | 6/2017 | Harada | |
| 9,742,424 B2 | 8/2017 | Sharma et al. | |
| 9,917,590 B2 | 3/2018 | Zhang et al. | |
| 10,003,353 B2 | 6/2018 | Kris et al. | |
| 10,103,753 B1 | 10/2018 | Nagarajan et al. | |
| 10,284,187 B1 | 5/2019 | K. et al. | |
| 10,284,188 B1 | 5/2019 | Soundarajan et al. | |
| 10,673,452 B1 | 6/2020 | Soundararajan et al. | |
| 10,673,453 B1 | 6/2020 | Pentakota | |
| 10,673,456 B1 | 6/2020 | Dusad et al. | |
| 10,778,243 B2 | 9/2020 | Pentakota et al. | |
| 10,840,934 B2 | 11/2020 | Benjaram et al. | |
| 10,958,258 B2 | 3/2021 | Soundararajan et al. | |
| 11,316,525 B1 | 4/2022 | Pentakota | |
| 11,316,526 B1 | 4/2022 | Rajagopal | |
| 2005/0104626 A1 | 5/2005 | Wakamatsu et al. | |
| 2006/0158365 A1 | 7/2006 | Kernahan et al. | |
| 2006/0220935 A1 | 10/2006 | Hughes et al. | |
| 2008/0297381 A1 | 12/2008 | Kernahan et al. | |
| 2009/0153388 A1 | 6/2009 | Waltari et al. | |
| 2009/0243907 A1 | 10/2009 | Nazemi et al. | |
| 2009/0302888 A1 | 12/2009 | Shumarayev et al. | |
| 2010/0060496 A1* | 3/2010 | Madisetti | H03M 1/0624 341/118 |
| 2010/0085101 A1 | 4/2010 | Walker | |
| 2010/0085232 A1 | 4/2010 | Nicolas | |
| 2010/0245149 A1 | 9/2010 | Danjo et al. | |
| 2011/0109348 A1 | 5/2011 | Chen et al. | |
| 2011/0109488 A1 | 5/2011 | Nakajima | |
| 2011/0234440 A1 | 9/2011 | Danjo | |
| 2012/0105264 A1 | 5/2012 | Ryu et al. | |
| 2012/0176158 A1 | 7/2012 | Lee et al. | |
| 2012/0212358 A1 | 8/2012 | Shi et al. | |
| 2012/0326904 A1 | 12/2012 | Jensen | |
| 2013/0009796 A1 | 1/2013 | Sakiyama et al. | |
| 2013/0021118 A1 | 1/2013 | Kabir et al. | |
| 2013/0106632 A1 | 5/2013 | Petigny et al. | |
| 2013/0169463 A1 | 7/2013 | Stein et al. | |
| 2014/0361917 A1 | 12/2014 | Matsuno et al. | |
| 2015/0008894 A1 | 1/2015 | Cannankurichi et al. | |
| 2015/0244386 A1 | 8/2015 | El Chammas | |
| 2015/0260552 A1 | 9/2015 | Yao et al. | |
| 2017/0117914 A1 | 4/2017 | Choi | |
| 2017/0214411 A1 | 7/2017 | Liu | |
| 2017/0230034 A1 | 8/2017 | Wei et al. | |
| 2019/0007071 A1 | 1/2019 | Nagarajan et al. | |
| 2019/0131997 A1 | 5/2019 | Liu et al. | |
| 2019/0280703 A1 | 9/2019 | Naru et al. | |
| 2019/0296756 A1 | 9/2019 | Ali | |
| 2020/0195268 A1 | 6/2020 | Soundarajan et al. | |
| 2020/0204184 A1 | 6/2020 | Rattan | |
| 2020/0259502 A1 | 8/2020 | Dusad et al. | |
| 2020/0403632 A1 | 12/2020 | Chen et al. | |
| 2021/0126644 A1 | 4/2021 | Sharma et al. | |
| 2021/0359694 A1 | 11/2021 | Chen et al. | |
| 2022/0224349 A1 | 7/2022 | Varshney et al. | |
| 2022/0247421 A1 | 8/2022 | Pentakota et al. | |
| 2022/0294461 A1 | 9/2022 | Huynh | |

FOREIGN PATENT DOCUMENTS

| | | |
|---|---|---|
| JP | H05206801 A | 8/1993 |
| JP | 2001044806 A | 2/2001 |
| KR | 20000028857 A | 5/2000 |
| KR | 20020015863 A | 3/2002 |
| WO | 2004038922 A2 | 5/2004 |

OTHER PUBLICATIONS

Notice of Allowance in corresponding U.S. Appl. No. 17/182,339, filed Apr. 24, 2024 (17 pages).
Notice of Allowance in corresponding U.S. Appl. No. 17/182,339, dated Jun. 26, 2024 (108 pages).
U.S. Appl. No. 16/517,796, Notice of Allowance, dated Feb. 6, 2020, (8 pages).
U.S. Appl. No. 16/410,698, Notice of Allowance, dated feb. 10, 2020, (8 pages).
U.S. Appl. No. 17/158,526, Notice of Allowance, dated Jan. 14, 2022, (19 pages).
International Search Report in corresponding PCT Patent Application No. PCT/2018-068162, mailed Apr. 25, 2019 (2 pages).
International Search Report in corresponding PCT Patent Application No. PCT/2021-063021, mailed Mar. 31, 2022 (3 pages).
International Search Report in corresponding PCT Patent Application No. PCT/2021-064260, mailed Apr. 7, 2022 (3 pages).
International Search Report in corresponding PCT Patent Application No. PCT/2022-012066, mailed Apr. 7, 2022 (2 pages).
International Search Report in corresponding PCT Patent Application No. PCT/2022-013802, mailed Apr. 28, 2022 (2 pages).
International Search Report in corresponding PCT Patent Application No. PCT/2022-014532, mailed May 5, 2022 (2 pages).

(56) References Cited

OTHER PUBLICATIONS

Machine Translation for KR20020015863A.
Machine Translation for KR20000028857A.
Machine Translation for JP2001044806A.
Machine Translation for JPH05206801A.
Machine Translation for CN111064468A.
Extended European Search Report, Application No. 22739954.0, dated Jun. 11, 2024, 10 pages.
Extended European Search Report, Application No. 22746794.1, dated Jun. 12, 2024, 9 pages.

* cited by examiner

CALIBRATION SCHEME FOR A NON-LINEAR ADC

CROSS REFERENCES TO RELATED APPLICATIONS

This application is a continuation of U.S. patent application Ser. No. 17/568,972, filed Jan. 5, 2022, which claims priority to India provisional patent application No. 202141001383, filed Jan. 12, 2021, titled "A Holistic Calibration Algorithm for Highly Non-Linear Multistage Delay Based ADCs," all of which are hereby incorporated herein by reference in their entireties.

TECHNICAL FIELD

This description relates generally to analog to digital converters (ADCs), and more particularly to using a lookup-table in ADCs.

BACKGROUND

In many electronic devices, an analog input signal is converted to a digital output signal using an analog to digital converter (ADC). The ADC used for digitizing a signal in a radio-frequency (RF) sampling receiver may be required to operate at high speed. Such speeds may be in the order of giga samples per second (GSPS). However, there is a need to correct the non-linearity of the high-speed ADCs.

SUMMARY

In described examples, an analog to digital converter (ADC), having an input operable to receive an analog signal and an output operable to output a digital representation of the analog signal, includes a voltage to delay (VD) block. The VD block is coupled to the input of the ADC and generates a delay signal responsive to a calibration signal. A backend ADC is coupled to the VD block, and receives the delay signal. The backend ADC having multiple stages including a first stage. A calibration engine is coupled to the multiple stages and the VD block. The calibration engine measures an error count of the first stage and stores a delay value of the first stage for which the error count is minimum.

The present disclosure also relates to a method of operating an analog to digital converter (ADC). The method includes generating a delay signal responsive to a calibration signal, providing the delay signal to a backend ADC, the backend ADC having a first stage of a plurality of stages, measuring an error count of the first stage by a calibration engine, the error count is an absolute difference in a number of ones and zeroes generated by the first stage, and storing a delay value of the first stage in the calibration engine for which the error count is minimum.

The present disclosure also relates to a device that includes a processor, a memory coupled to the processor, and an analog to digital converter (ADC). The ADC is coupled to the processor and the memory. The ADC, having an input operable to receive an analog signal and an output operable to output a digital representation of the analog signal, includes a voltage to delay (VD) block. The VD block is coupled to the input of the ADC and generates a delay signal responsive to a calibration signal. A backend ADC is coupled to the VD block, and receives the delay signal. The backend ADC having multiple stages including a first stage. A calibration engine is coupled to the multiple stages and the VD block. The calibration engine measures an error count of the first stage and stores a delay value of the first stage for which the error count is minimum.

BRIEF DESCRIPTION OF THE DRAWINGS

The same reference numbers or other reference designators are used in the drawings to designate the same or similar (structurally and/or functionally) features.

DETAILED DESCRIPTION OF EXAMPLE EMBODIMENTS

Figure 1:
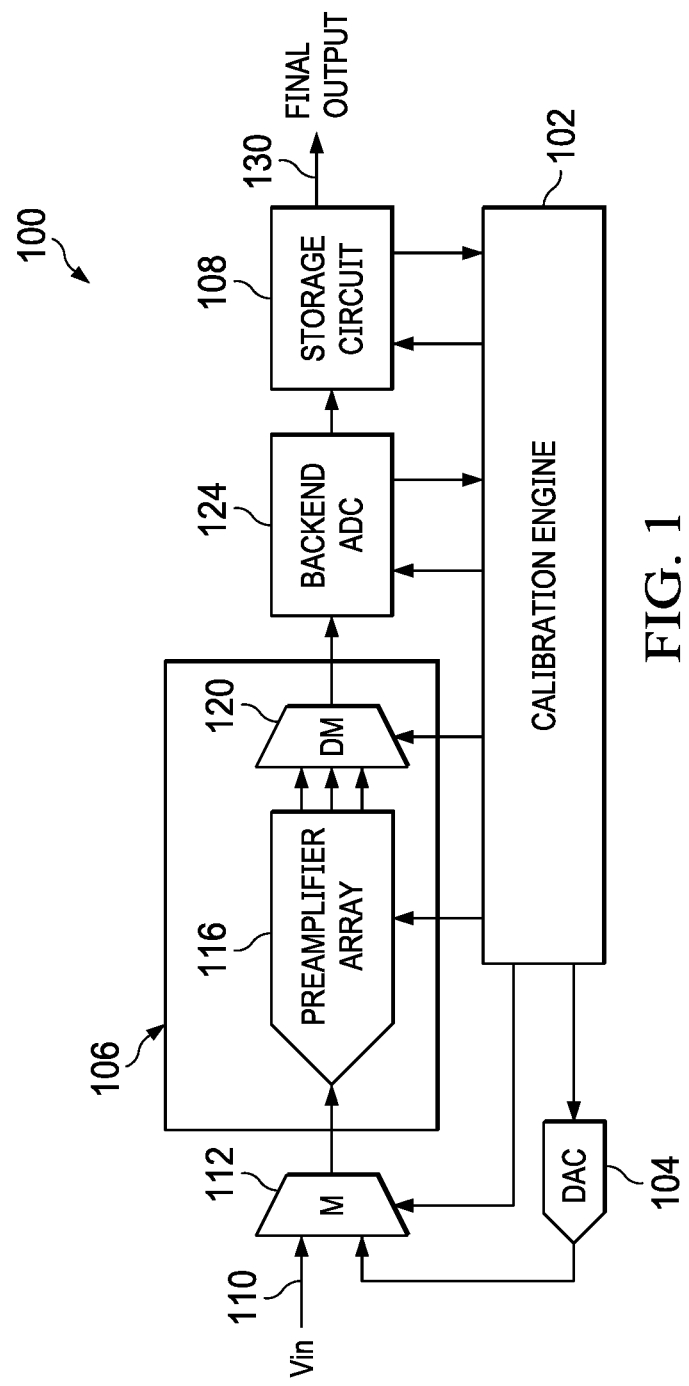
FIG. 1 is a block diagram of a circuit, according to an example embodiment.

FIG. 1 is a block diagram of a circuit 100, according to an example embodiment. The circuit 100 includes a calibration engine 102, a digital to analog converter (DAC) 104, a multiplexer M 112, a voltage to delay (VD) block 106, a backend analog to digital converter (ADC) 124 and a storage circuit 108. The DAC 104 is coupled between the calibration engine 102 and the multiplexer M 112. The multiplexer M 112 is also coupled to the calibration engine 102. In one version, the multiplexer M 112 is controlled by the calibration engine 102. The multiplexer M 112 receives an input voltage Vin 110. The VD block 106 is coupled to the multiplexer M 112 and the calibration engine 102. The backend ADC 124 is coupled to the VD block 106 and the calibration engine 102. The storage circuit 108 is coupled to the backend ADC 124 and the calibration engine 102. The storage circuit 108 may be constructed of digital memory circuits, register, flip-flops, RAM, ROM, transitory memory, part of a conventional memory circuit and/or part of a digital processor system.

Figure 3:
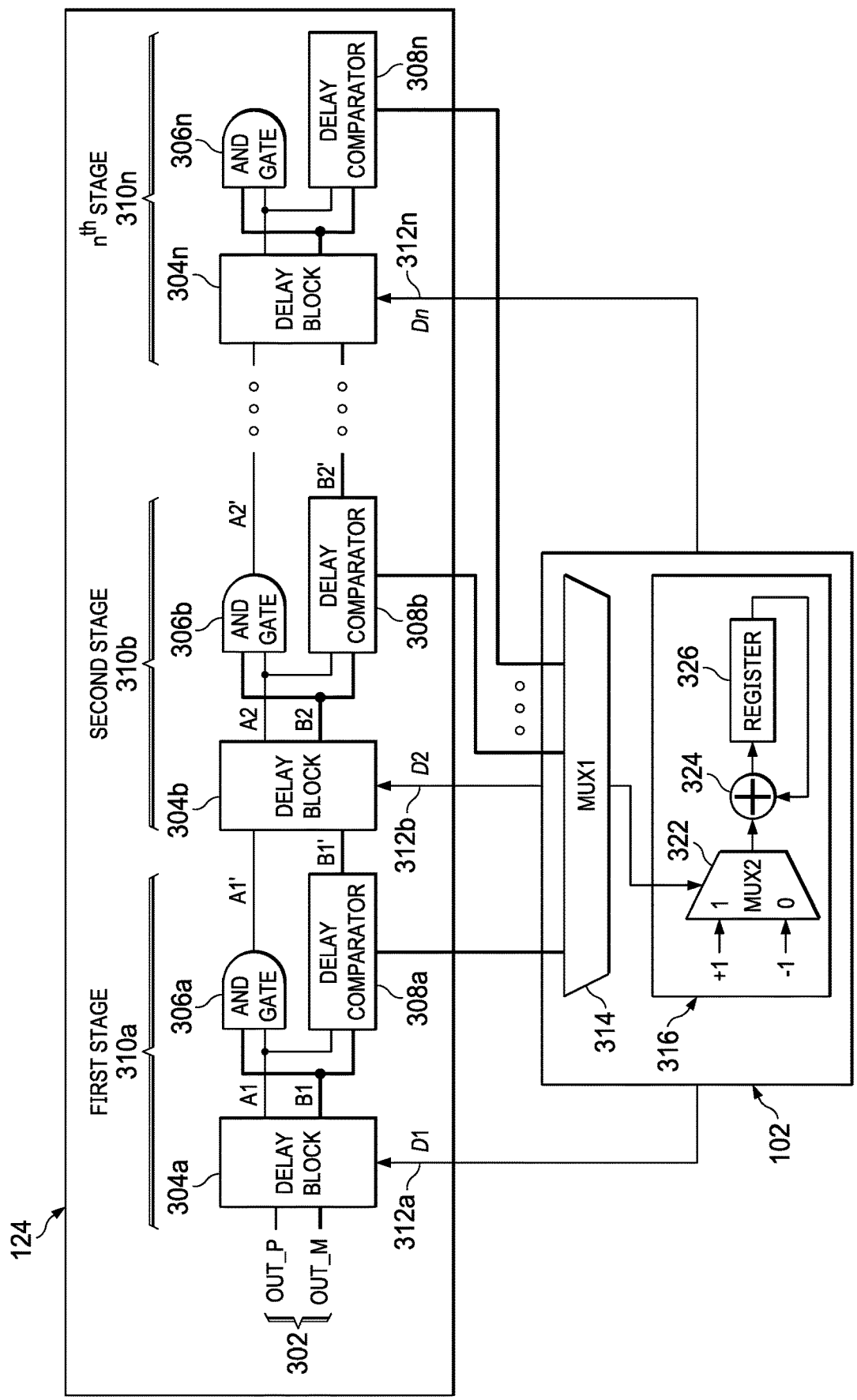
FIG. 3 is a block diagram of a portion of the circuit illustrated in FIG. 1, according to an example embodiment.

The VD block 106 includes a preamplifier array 116 and a delay multiplexer DM 120. The preamplifier array 116 is coupled to the multiplexer M 112 and includes one or more preamplifiers. The delay multiplexer DM 120 is coupled to the preamplifier array 116. The backend ADC 124 is coupled to the delay multiplexer DM 120. The backend ADC 124 may include multiple stages, such as a first stage and a second stage as illustrated in FIG. 3. Each stage includes a delay block, an AND gate and a delay comparator. The calibration engine 102 is coupled to the multiple stages in the backend ADC 124. The calibration engine 102, in one example, includes an accumulator. The accumulator is coupled to the multiple stages in the backend ADC 124. The calibration engine 102, in one example, is or is a part of, a processing unit, a digital signal processor (DSP), a processor and/or a programmable logic device. The calibration engine 102 may include memory, logic and/or software.

In some example embodiments, each of the components of the VD block 106 are capable of communicating with the calibration engine 102 independently, and with other components of the circuit 100. Each block or component of the circuit 100 may also be coupled to other blocks in FIG. 1. Those connections are not described herein. The circuit 100 may include one or more conventional components that are not described herein for simplicity of the description.

The circuit 100, in one example, is an analog to digital converter where the VD block 106 performs a voltage-to-delay function and the backend ADC 124 perform a delay-to-digital function. The circuit 100 operates in a delay-calibration mode, a memory-calibration mode and a mission mode. The mission mode is also referred as normal operation mode. The delay-calibration mode and the memory-calibration mode are now explained, in that order.

The calibration engine 102 generates multiple input codes which, in some example embodiments, correspond to a range of a known analog signal. In one example, the multiple input codes range from a minimum input code to a maximum input code. The multiple input codes, in one example, are uniformly distributed both in terms of frequency and step size. Step size, in one version, is a difference between two consecutive input codes. The DAC 104 generates calibration signal in response to each of the multiple input codes. For example, the DAC 104 generates a first calibration signal (e.g. a first analog calibration signal) in response to a first input code of the multiple input codes. The first calibration signal is received by the VD block 106.

Figure 2:
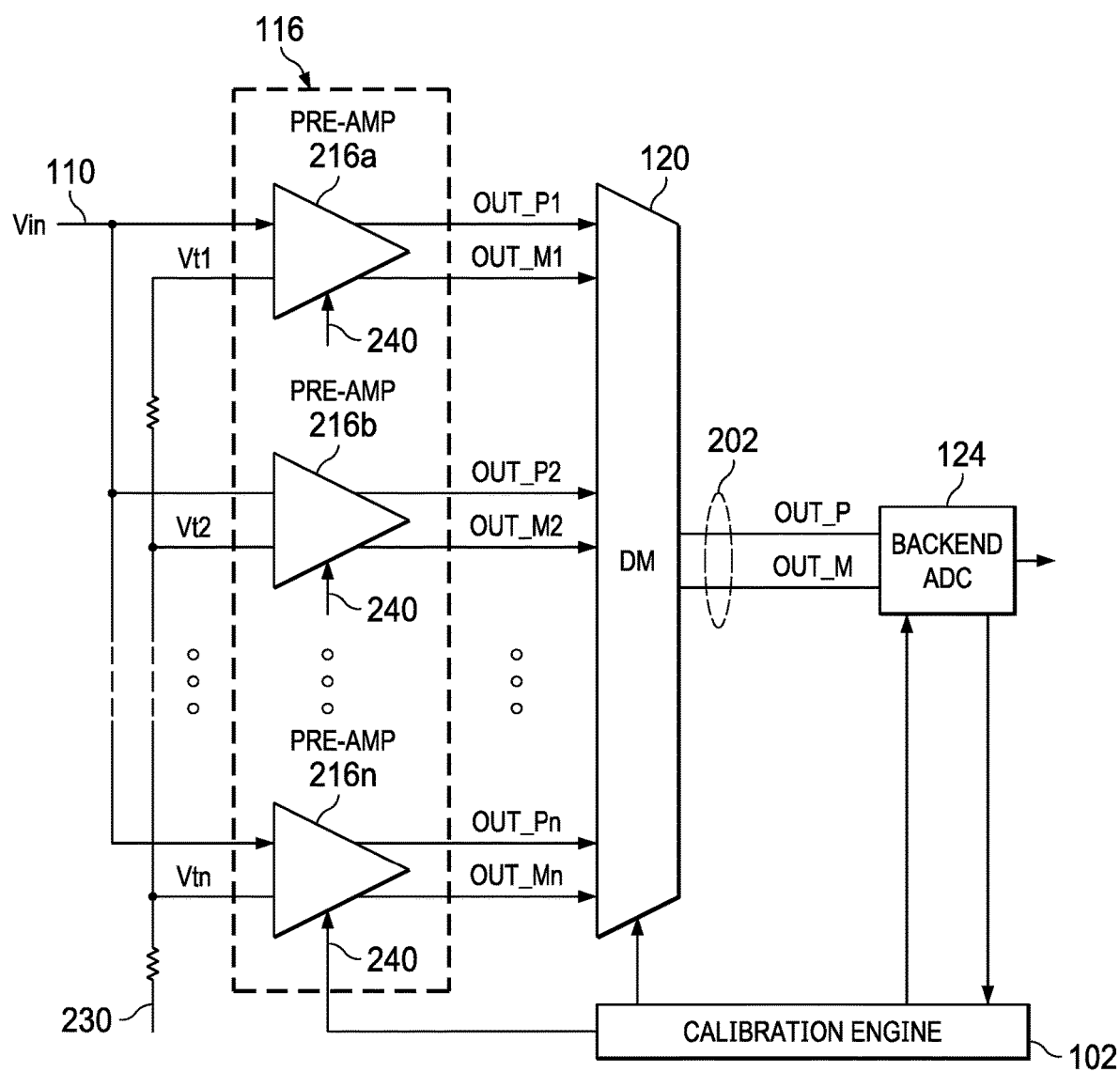
FIG. 2 is a block diagram of a portion of the circuit illustrated in FIG. 1, according to an example embodiment.

The multiplexer M 112, in both delay-calibration mode and memory-calibration mode, provides the first calibration signal to the preamplifier array 116. The multiplexer M 112, in one example, is controlled by the calibration engine 102. Each pre-amplifier in the VD block 106 has a different threshold voltage. As illustrated in FIG. 2, each pre-amplifier in the preamplifier array 116 includes a first input connected to the output of the multiplexer M 112 (to receive the input signal, Vin 110 or the calibration signal from the DAC 104) and a second input coupled to a threshold voltage. Each pre-amplifier in the preamplifier array 116, in both delay-calibration mode and memory-calibration mode, compares the first calibration signal to a threshold voltage (e.g. the threshold voltage associated with each preamplifier in the preamplifier array 116). The delay multiplexer DM 120 generates a delay signal based on an output of one of the preamplifiers.

The first stage in the backend ADC 124 generates a digital bit in response to the delay signal from the delay multiplexer DM 120. Thus, the calibration engine 102 generates multiple input codes; the DAC 104 generates multiple calibration signals in response to the multiple input codes; and the VD block 106 generates multiple delay signals in response to the multiple calibration signals; and the first stage in the backend ADC 124 generates multiple digital bits in response to the multiple delay signals. These multiple digital bits generated by the first stage represents a digital code generated by the first stage in response to the multiple input codes generated by the calibration engine 102.

The delay-calibration mode, in one example, includes multiple cycles. In one cycle, the calibration engine 102 modifies a delay value of a first delay block in the first stage. The calibration engine 102 generates multiple input codes. The first stage in the backend ADC 124 generates a digital code in response to the multiple input codes. The accumulator in the calibration engine 102 measures an error count of the first stage. The error count is an absolute difference in a number of ones and zeroes in the digital code. Based on the error count, the calibration engine 102 modifies the delay value of the first delay block in the subsequent cycle. The calibration engine 102 measure the error counts generated by the first stage in multiple such cycles. The calibration engine 102 stores a delay value of the first stage for which the error count of the first stage is minimum. This delay value is the delay value (or calibrated delay value) of the first delay block in the first stage. In one example, the circuit 100 uses a binary search or other known technique to find the delay value for which error count is minimum. A non-linearity at an output of a stage of backend ADC 124 is caused by a non-linear transfer function of that stage. The delay-calibration mode calibrates the stage to define an optimal gain for that stage across a range defined by multiple input codes.

The calibration engine 102 subsequently calibrates the delay value of a second delay block in the second stage. This includes multiple cycles as well. In one cycle, the calibration engine 102 modifies a delay value of the second delay block in the second stage. The calibration engine 102 generates multiple input codes. The second stage generates a digital code in response to the multiple input codes. The accumulator in the calibration engine 102 measures an error count of the second stage. The error count is an absolute difference in a number of ones and zeroes in the digital code. Based on the error count, the calibration engine 102, in the subsequent cycle, modifies the delay value of the second delay block. The calibration engine 102 measures the error counts generated by the second stage in multiple such cycles. The calibration engine 102 stores the delay value of the second stage for which the error count of the second stage is minimum. This delay value is the delay value (or calibrated delay value) of the second delay block in the second stage.

In the same way, the calibration engine 102 measures an error count of each stage of the multiple stages in the backend ADC 124 across multiple cycles, and also stores a delay value of each stage of the backend ADC 124. The delay value (or calibrated delay value) for each stage of the multiple stages in the backend ADC 124 are used subsequently during other modes of operation of the circuit 100. In one example, the delay values are used to correct any non-linearities introduced in the backend ADC 124. The delay-calibration mode is explained in detail in connection with circuit 300 illustrated in FIG. 3.

In the memory-calibration mode, the calibration engine 102 generates multiple input codes. The multiple input codes, in some example embodiments, correspond to a range of a known analog signal. The DAC 104 generates a calibration signal in response to an input code of the multiple input codes. The VD block 106 generates a delay signal in response to the calibration signal. The backend ADC 124 generates an output code in response to the delay signal. The storage circuit 108 stores the input code at an address associated with the corresponding output code. For example, the storage circuit 108 stores a first input code at an address corresponding to the first output code, and the storage circuit 108 stores a second input code at an address corresponding to a second output code. In one example embodiment, the storage circuit 108 maintains, for all input codes, a look-up table to store an input code at an address corresponding to an associated output code. For example, in one version, when an output code 100 is generated corresponding to the input code 010, the input code 010 is stored at the address 100 in the look-up table. Thus, the look-up table in the storage circuit 108 is populated in the memory-calibration mode with the input codes at respective addresses of output codes.

In the mission mode, the multiplexer M 112 provides the input voltage Vin 110 to the VD block 106. The multiplexer M 112, in one example embodiment, is controlled by the calibration engine 102. The VD block 106 generates a delay signal in response to the input voltage Vin 110. The backend ADC 124 generates a raw code in response to the delay signal. An input code stored at an address corresponding to the raw code is generated as a final output 130 by the circuit 100. For each value of the input voltage Vin 110, the raw code is matched to an address of the output code, and the input code stored at the address is provided as the final output 130. Thus, the mission mode represents, in one version, normal operation of the circuit 100 in which an analog signal (such as a radio frequency analog signal) is received as Vin 110 and converted to a digital (e.g. binary) representation via the VD block 106, the backend ADC 124 and the storage circuit 108. The final output 130 is thus a digital representation of the analog signal Vin 110.

The multiplexer M 112, the VD block 106, the backend ADC 124 and the storage circuit 108 form one channel in the circuit 100. The circuit 100 can be implemented with two or more channels. In one example embodiment, each channel may be implemented in parallel with other channels. A second channel would include a second multiplexer, a second VD block, a second backend ADC and a second storage circuit. The second backend ADC in the second channel may be similar to the backend ADC 124 but both are calibrated separately as both may have different transfer functions because of manufacturing variations. Multiple channels allow the flexibility to have one channel in calibration mode (delay-calibration mode or memory-calibration mode) and the other channels operate in mission mode. Multiple channels also allow flexibility to have one or more channels in delay-calibration mode, one or more channels in memory-calibration mode and other channels in mission mode. Thus, when one or more channels are being calibrated, remaining channels are used in mission mode for analog to digital conversion. In one example, all the channels are calibrated using the DAC 104, and all channels are controlled by the calibration engine 102. In some example embodiments, there is no need to perform any matching between the channels as the backend ADC in each channel is calibrated independently. This also reduces the requirement of background estimation and calibration algorithms.

The combination of the preamplifier array 116, the delay multiplexer DM 120 and the backend ADC 124, in one example, acts as a non-linear ADC or delay-based ADC. Though this combination is highly non-linear, the circuit 100 is highly linear and operates at high speed with relaxed area and power requirements. The circuit 100 scales well with technology nodes. The circuit 100 pushes the high linearity requirement on the DAC 104. This is advantageous because it is relatively less difficult to design and implement analog circuits for operation at lower speed with linearity and accuracy. According to the present disclosure, the backend ADC 124 may be designed to run at high speed by compromising linearity. However, with the backend ADC 124 operating in conjugation with the look-up table in the storage circuit 108, the circuit 100 behaves like a linear analog to digital converter (ADC). Likewise, the storage circuit 108 may be implemented in digital circuits, and be configured for high speed.

Interfacing external analog signals to fast digital processing cores generally requires an ADC. With higher speeds in transmission of data, the ADC may be required to operate at very high speeds and with a good signal-to-noise ratio. Without the benefits of some example embodiments, such constraints could result in large power dissipation and large area requirements for the supporting integrated circuit. These issues may be especially prominent at fast sampling rates (for example, sampling rates in the order of giga-samples per second (GSPS)) because of analog non-idealities which may limit performance. The example embodiments of circuit 100 provides a backend ADC 124 with the lookup-table approach that can open up wide architectures using one or more non-linear ADCs but can be calibrated to provide the superior performance of a highly linear ADC.

In delay-calibration mode, a delay value of each delay block in the backend ADC 124 is calibrated and fixed. This ensures that the circuit 100 has a minimum gain throughout multiple input codes (which corresponds to a range of a known analog signal) generated by the calibration engine 102. The gain of circuit 100 is affected by delay value of each stage in the backend ADC 124, and the delay-calibration mode ensures that the delay value of each stage is calibrated optimally for the circuit 100 to operate as a linear high-speed ADC. The delay-calibration mode allows circuit 100 to act as a linear ADC as delays of each stage in the backend ADC 124 is calibrated to achieve optimal gain across a range defined by multiple input codes.

Hence, the circuit 100 does not require any complex algorithms or hardware for digital conversion of the input voltage Vin 110. This reduces the area and power requirements of the circuit 100. Thus, the circuit 100 is capable of being used in RF sampling receivers which operate at speeds of GSPS. The circuit 100 scales well with technology nodes and is capable of supporting high GSPS transfer rates in future technology nodes.

FIG. 2 is a block diagram of a portion of the circuit 100 illustrated in FIG. 1, according to an example embodiment. The preamplifier array 116 includes multiple preamplifiers from 1 to n, where n is an integer, for example, pre-amp 216*a*, pre-amp 216*b* to pre-amp 216*n*. In one example embodiment, one or more preamplifiers is a threshold integrated preamplifier (a preamplifier with a fixed threshold). The delay multiplexer DM 120 is coupled to the multiple preamplifiers in the preamplifier array 116. The backend ADC 124 is coupled to an output of the delay multiplexer DM 120. The calibration engine 102 is coupled to each preamplifier in the preamplifier array 116 via input line 240, the delay multiplexer DM 120 and the backend ADC 124. The calibration engine 102, in one example, reset the preamplifiers through input line 240.

In operation, the preamplifier array 116 receives the input voltage Vin 110, in mission mode, from the multiplexer M 112. Similar to amplifiers 54-60 of U.S. Pat. No. 10,673,456 (which is hereby incorporated by reference in its entirety), each preamplifier receives a different threshold voltage. For example, the pre-amp 216*a* receives a threshold voltage Vt1, the pre-amp 216*b* receives a threshold voltage Vt2 and the pre-amp 216*n* receives a threshold voltage Vtn. In one example, Vt1<Vt2<Vtn. The threshold voltages Vt1, Vt2 to Vtn are generated using, in one example embodiment, a voltage divider 230. In one version, the pre-amp 216*n* is coupled to a voltage supply directly or through a resistor. Each preamplifier generates a first and a second output signals (differential output signals) based on the difference between the input voltage Vin 110 and the threshold voltage. For example, the pre-amp 216*a* generates differential signals—a first output signal OUT_M1 and a second output signal OUT_P1. Similarly, the pre-amp 216*n* generates differential signals—a first output signal OUT_Mn and a second output signal OUT_Pn.

Similar to the operation of multiplexer 211 in U.S. Pat. No. 10,673,452 (which is hereby incorporated by reference in its entirety), the delay multiplexer DM 120 receives the first and the second output signal (differential output signals) from each preamplifier of the multiple preamplifiers. The delay multiplexer DM 120 generates a delay signal 202 based on an output of one of the preamplifiers. The delay signal 202 includes a first delay signal OUT_M and a second delay signal OUT_P, and corresponds to the output signals of a preamplifier whose threshold voltage is closest to the input voltage Vin 110. For example, if the magnitude of the input voltage Vin 110 is closest to the threshold voltage Vt1 of the pre-amp 216*a*, the first delay signal OUT_M and the second delay signal OUT_P corresponds to the first and second output signals OUT_M1 and OUT_P1 of the pre-amp 216*a*. On the other hand, if the magnitude of the input voltage Vin 110 is closest to the threshold voltage Vt2 of the pre-amp 216*b*, the first delay signal OUT_M and the second delay signal OUT_P corresponds to the first and second output signals OUT_M2 and OUT_P2 of the pre-amp 216*b*. In one example, the calibration engine 102 controls the delay multiplexer DM 120 to select the output signals of a preamplifier whose threshold voltage is closest to the input voltage Vin 110. In another example, the calibration engine 102 controls the delay multiplexer DM 120 in calibration mode (both delay-calibration mode and memory-calibration mode), and a high-speed logic controls the delay multiplexer DM 120 in the mission mode. In some example embodiments, the high-speed logic includes a processor, memory, digital logic and/or a state machine.

In some example embodiments, the VD block 106 (combination of the preamplifier array 116 and the delay multiplexer DM 120) converts the input voltage Vin 110 into delay signal 202 (OUT_P and OUT_M), such that the timings of the delay signal 202 (OUT_P and OUT_M) are representative of the input voltage Vin 110. The VD block 106, which may be used to generate the delay signal 202 (OUT_P and OUT_M) based on the input voltage Vin 110, may be constructed and operated, for example, as described in U.S. Pat. No. 10,673,456 (based on U.S. patent application Ser. No. 16/410,698). The VD block 106 may include, for example, a conversion and folding circuit described in U.S. Pat. No. 10,673,456, which includes multiple preamplifiers for converting a voltage signal into delay signal, and also includes a folding block that contains multiple logic gates for selecting earlier-arriving and later-arriving ones of the first delay signal OUT_M and a second delay signal OUT_P.

Examples of voltage-to-delay devices which may be incorporated within the VD block 106, and used to generate the delay signal 202 (OUT_P and OUT_M) based on the input voltage Vin 110, are illustrated in U.S. patent application Ser. No. 17/131,981, filed Dec. 23, 2020. A voltage-to-delay device constructed in accordance with U.S. patent application Ser. No. 17/131,981 may have, for example, first and second comparators connected to first and second lines carrying complementary voltages representative of the input voltage Vin 110, for generating first and second output signals during an active phase when the complementary voltages reach a suitable threshold voltage, such that delay between the output signals is representative of the input voltage Vin 110. The present disclosure is not limited, however, to the devices and processes described in detail herein. Other suitable devices may perform a suitable voltage-to-delay function within the VD block 106. As noted above, the entire disclosures of U.S. Pat. No. 10,673,456 and U.S. patent application Ser. No. 17/131,981 are incorporated herein by reference.

The preamplifiers (pre-amp 216*a*, pre-amp 216*b* to pre-amp 216*n*) within the preamplifier array 116 have varying gains (e.g. "gain" as used herein may mean voltage gain, current gain or a delay—as discussed in more detail below, amplifiers/comparators have different delays based on the input signals) as a result of various factors, which may include design, process, input voltage Vin 110, and/or temperature. In one example, the gains and ranges of the preamplifier pre-amp 216*a*, pre-amp 216*b* to pre-amp 216*n* may be adjusted, and preferably matched across the preamplifier array 116. The preamplifier array 116 and the backend ADC 124 enables the circuit 100 to operate as a high-speed and high-performance analog to digital converter (ADC).

FIG. 3 is a block diagram of a portion of the circuit 100 illustrated in FIG. 1, according to an example embodiment. The backend ADC 124 includes multiple stages illustrated as: a first stage 310*a*, a second stage 310*b* to an $n^{th}$ stage 310*n*, where n is an integer greater than or equal to one and is not necessary equivalent to the value of n used in FIG. 2. Each stage includes a delay block, an AND gate and a delay comparator. For example, the first stage 310*a* includes a delay block 304*a*, an AND gate 306*a* and a delay comparator 308*a*. Similarly, the second stage 310*b* includes a delay block 304*b*, an AND gate 306*b* and a delay comparator 308*b*. The illustrated AND gates are merely examples, however, of logic gates that may be employed according to this disclosure. If desired, this disclosure may be implemented with or without AND gates and/or with or without gates other than AND gates. Further, in the illustrated configuration, the AND gates 306*a*, 306*b* to 306*n* may be essentially identical to each other, and the delay comparators 308*a*, 308*b* to 308*n* may be essentially identical to each other.

The calibration engine 102 is coupled to the multiple stages in the backend ADC 124. The calibration engine 102 includes a first multiplexer MUX1 314 and an accumulator 316. The accumulator 316 includes a second multiplexer MUX2 322, an adder 324 and a register 326. The delay block in each stage of the backend ADC 124 is coupled to the calibration engine 102. For example, the delay block 304*a*, the delay block 304*b* to the delay block 304*n* are coupled to the calibration engine 102. The delay comparator in each stage of the backend ADC 124 is coupled to the first multiplexer MUX1 314 in the calibration engine 102. For example, the delay comparator 308*a*, the delay comparator 308*b* to the delay comparator 308*n* are coupled to the first multiplexer MUX1 314 in the calibration engine 102.

The accumulator 316 is coupled to the first multiplexer MUX1 314. The second multiplexer MUX2 322 is coupled to the first multiplexer MUX1 314. The adder 324 is coupled to the second multiplexer MUX2 322 and the register 326. It is understood that the calibration engine 102 can include multiple other parts which are not illustrated here for simplicity. The calibration engine 102 may include one or more conventional components that are not described herein for simplicity of the description. Multiple components of backend ADC 124 may be coupled to and communicate with the calibration engine 102. However, these connections are not shown in FIG. 3 for simplicity.

In operation, signals AN and BN (where N=1, 2 . . . n, for first stage 310*a*, second stage 310*b* to $n^{th}$ stage 310*n* respectively) are received by respective ones of the AND gates 306a, 306b to 306n. The AND gates 306a, 306b to 306(n-1) generate corresponding signals AN'. For example, AND gate 306a receives signal A1 and B1 and generates A1'. For each one of the AND gates, the timing of the leading edge of signal AN' tracks the timing of the leading edge of the later-arriving of signals AN and BN.

The circuit 100 operates in a delay-calibration mode, a memory-calibration mode and a mission mode. The delay-calibration mode and the memory-calibration mode are now explained, in that order. The calibration engine 102 generates multiple input codes. The multiple input codes, in some example embodiments, correspond to a range of a known analog signal. In one example, the multiple input codes range from a minimum input code to a maximum input code. The multiple input codes, in one example, are uniformly distributed both in terms of frequency and step size. Step size, in one version, is a difference between two consecutive input codes. The DAC 104 generates calibration signal in response to each of the multiple input codes. For example, the DAC 104 generates a first calibration signal (e.g. a first analog calibration signal) in response to a first input code of the multiple input codes. The first calibration signal is received by the VD block 106.

The multiplexer M 112, in both delay-calibration mode and memory-calibration mode, provides the first calibration signal to the preamplifier array 116. The multiplexer M 112, in one example, is controlled by the calibration engine 102. Each pre-amplifier in the VD block 106 has a different threshold voltage. As discussed in connection with FIG. 2, the delay multiplexer DM 120 outputs a delay signal 302 based on an output of one of the preamplifiers. The delay signal 302 includes differential signals (a first delay signal OUT_M and a second delay signal OUT_P), and corresponds to the output signals of a preamplifier whose threshold voltage is closest to the calibration signal. In one example, the calibration engine 102 enables the delay multiplexer DM 120 in calibration mode (both delay-calibration mode and memory-calibration mode), and a high-speed logic enables the delay multiplexer DM 120 in the mission mode. In some example embodiments, the high-speed logic includes a processor, memory, digital logic and/or a state machine.

The backend ADC 124 receives the delay signal 302 (OUT_P and OUT_M) from VD block 106. The timings of the first delay signal OUT_M and a second delay signal OUT_P have a delay which is representative of the input voltage Vin 110. The first stage 310a in the backend ADC 124 generates a digital bit in response to the delay signal 302 from the delay multiplexer DM 120. Thus, the calibration engine 102 generates multiple input codes, the VD block 106 generates multiple delay signals in response to multiple input codes and the first stage 310a in the backend ADC 124 generates multiple digital bits in response to the multiple delay signals. These multiple digital bits generated by the first stage 310a represents a digital code generated by the first stage in response to the multiple input codes generated by the calibration engine 102. Thus, the digital code includes multiple digital bits, and a digital bit corresponds to an input code.

The delay-calibration mode may be implemented over multiple cycles. For example, with reference to a delay calibration of the first stage 310a, in one cycle, the calibration engine 102 modifies a delay value D1 312a of the delay block 304a in the first stage 310a. The calibration engine 102 generates multiple input codes. The first stage 310a in the backend ADC 124 generates a digital code in response to the multiple input codes. The digital code from the first stage 310a is provided to the accumulator 316 in the calibration engine 102 through the first multiplexer MUX1 314. The accumulator 316 in the calibration engine 102 measures an error count of the first stage 310a. The error count is an absolute difference in a number of ones and zeroes in the digital code.

In operation, the accumulator 316 processes the digital bits in the digital code serially, in one version. The accumulator 316 includes the second multiplexer MUX2 322 which receives the digital bit from the first multiplexer MUX1 314. Based on the digital bit, the second multiplexer MUX2 322 generates one of the inputs, +1 or −1. The adder 324 adds a previous value of the error count which is stored in the register 326 to the input received from the second multiplexer MUX2 322, and generates a new value of the error count. This new value of the error count is stored in the register 326.

Based on the error count stored in the register 326, the calibration engine 102 modifies the delay value D1 312a of the delay block 304a in a subsequent cycle (e.g. a next cycle). The calibration engine 102 measures the error count generated by the first stage 310a in multiple such cycles. The calibration engine 102 stores a delay value of the first stage 310a for which the error count of the first stage 310a is minimum. This delay value is the delay value D1 312a of the delay block 304a in the first stage 310a. The delay value D1 312a of the first stage 310a is stored in a memory location (not shown in FIG. 3) specific to the first stage 310a. Thus, the calibration engine 102 provides multiple input codes over multiple cycles, and a delay value of a stage (for example the first stage 310a) is iteratively modified until the delay-calibration mode for that stage is complete. A non-linearity at an output of a stage of backend ADC 124 is caused by a non-linear transfer function of that stage. The delay-calibration mode calibrates the stage to define an optimal gain for that stage across a range defined by multiple input codes. For example, the stored delay value D1 312a of the first stage 310a is used to compensate any non-linearity caused by the non-linear transfer function of the first stage 310a. Hence, the delay calibration mode calibrates the first stage 310a to achieve an optimal gain for the first stage 310a across a range defined by multiple input codes.

Once the first stage 310a is calibrated, the calibration engine 102 calibrates a delay value D2 312b of the delay block 304b in the second stage 310b. This includes multiple cycles as well. In one cycle, the calibration engine 102 modifies the delay value D2 312b of the delay block 304b in the second stage 310b. The calibration engine 102 generates multiple input codes. The second stage 310b generates a digital code in response to the multiple input codes. The accumulator 316 in the calibration engine 102 measures an error count of the second stage 310b. The error count is an absolute difference in a number of ones and zeroes in the digital code. Based on the error count stored in the register 326, the calibration engine 102 modifies the delay value D2 312b of the delay block 304b in the subsequent cycle. The calibration engine 102 measures the error count generated by the second stage 310b in multiple such cycles. The calibration engine 102 stores a delay value of the second stage 310b for which the error count of the second stage 310b is minimum. This delay value is the delay value D2 312b of the delay block 304b in the second stage 310b. The delay value D2 312b may be stored in a memory location (not shown in FIG. 3) specific to the second stage 310b or in the same memory as the stored delay value D1 312a or in a separate memory.

In the same way, the calibration engine 102 measures an error count of each stage of the multiple stages in the backend ADC 124 across multiple cycles, and also stores a delay value of each stage of the backend ADC 124. Based on the error count of each stage, the delay value, for each stage is modified by the calibration engine 102 to get optimal uniform gain till that stage. Thus, the delay calibration mode may be performed iteratively whereby a delay value of a stage is calibrated over one or more cycles followed by calibrating a delay value of a next stage. During the calibration-mode, each stage (310a, 310b ... 310n) is iteratively calibrated and a corresponding delay value (D1, D2 ... Dn) is generated and stored, as described above. The delay value (or calibrated delay value) for each stage of the multiple stages in the backend ADC 124 are used subsequently during other modes of operation of the circuit 100. Thus, the circuit 100 uses a single accumulator 316 for calibrating all the stages in the backend ADC 124.

In the memory-calibration mode, the calibration engine 102 generates multiple input codes. The multiple input codes, in some example embodiments, correspond to a range of a known analog signal. The DAC 104 generates a calibration signal in response to an input code of the multiple input codes. The VD block 106 generates a delay signal in response to the calibration signal. The backend ADC 124 generates an output code in response to the delay signal. The delay values of multiple stages in the backend ADC 124 stored during the delay-calibration mode are used in the memory calibration mode to generate the output code. The storage circuit 108 stores the input code at an address associated with the corresponding output code. For example, the storage circuit 108 stores a first input code at an address corresponding to the first output code, and the storage circuit 108 stores a second input code at an address corresponding to a second output code. In one example embodiment, the storage circuit 108 maintains, for all input codes, a look-up table to store an input code at an address corresponding to an associated output code. For example, in one version, when an output code 100 is generated corresponding to the input code 010, the input code 010 is stored at the address 100 in the look-up table. Thus, the look-up table in the storage circuit 108 is populated in the memory-calibration mode with the input codes at respective addresses of output codes.

In the mission mode, the multiplexer M 112 provides the input voltage Vin 110 to the VD block 106. The multiplexer M 112, in one example embodiment, is controlled by the calibration engine 102. The VD block 106 generates a delay signal in response to the input voltage Vin 110. The backend ADC 124 generates a raw code in response to the delay signal. An input code stored at an address corresponding to the raw code is generated as a final output 130 by the circuit 100. For each value of the input voltage Vin 110, the raw code is matched to an address of the output code, and the input code stored at the address is provided as the final output 130. Thus, when the input voltage Vin 110 is received by the circuit 100, a digital code corresponding to the input voltage Vin 110 is generated by the circuit 100 and the look-up table in the storage circuit 108 is used by the circuit 100 in conversion of the input voltage Vin 110 to the digital code.

In delay-calibration mode, a delay value of each delay block in the backend ADC 124 is calibrated and fixed. This ensures that the circuit 100 has a minimum gain throughout multiple codes (which corresponds to a range of a known analog signal) generated by the calibration engine 102. The gain of circuit 100 is affected by delay value of each stage in the backend ADC 124, and the delay-calibration mode ensures that the delay value of each stage is calibrated optimally for the circuit 100 to operate as a linear high-speed ADC. The delay-calibration mode allows circuit 100 to act as a linear ADC as delays of each stage in the backend ADC 124 is calibrated to achieve optimal gain across a range defined by multiple input codes.

Hence, the circuit 100 does not require any complex algorithms or hardware for digital conversion of the input voltage Vin 110. This reduces the area and power requirements of the circuit 100. Thus, the circuit 100 is capable of being used in RF sampling receivers which operate at speeds of GSPS. The circuit 100 scales well with technology nodes and is capable of supporting high GSPS transfer rates in future technology nodes.

Figure 4:
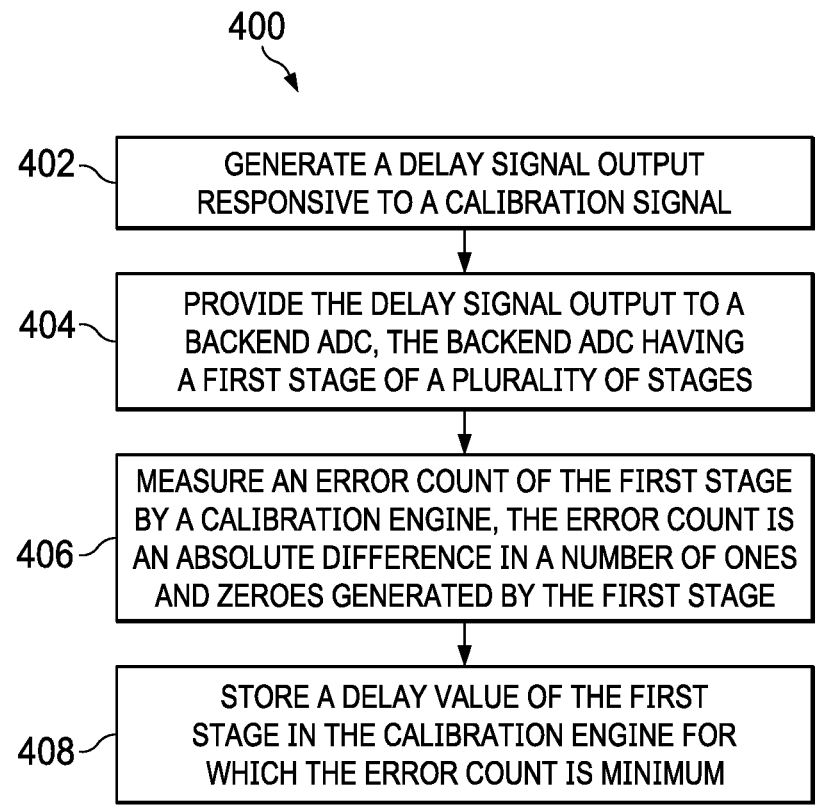
FIG. 4 is a flowchart of a method of operation of a circuit, according to an example embodiment.

FIG. 4 is a flowchart 400 of a method of operation of a circuit, according to an example embodiment. The flowchart 400 is described in connection with the circuit 100 of FIG. 1 and/or its components illustrated in FIG. 2 and FIG. 3. The flowchart 400 illustrates a methodology for operating a circuit in delay calibration mode. At step 402, a delay signal is generated in response to a calibration signal. In circuit 100, the calibration engine 102 generates multiple input codes. The multiple input codes, in some example embodiments, correspond to a range of a known analog signal. In one example, the multiple input codes range from a minimum input code to a maximum input code. The multiple input codes, in one example, are uniformly distributed both in terms of frequency and step size. Step size, in one version, is a difference between two consecutive input codes. The DAC 104 generates calibration signal in response to each of the multiple input codes. For example, the DAC 104 generates a first calibration signal (e.g. a first analog calibration signal) in response to a first input code of the multiple input codes. The VD block 106 receives the calibration signal and generates the delay signal. The VD block 106 includes the preamplifier array 116 and the delay multiplexer DM 120. The multiplexer M 112 provides the first calibration signal to the preamplifier array 116. The multiplexer M 112, in one example, is controlled by the calibration engine 102. Each pre-amplifier in the VD block 106 has a different threshold voltage. Each pre-amplifier in the preamplifier array 116, in both delay-calibration mode and memory-calibration mode, compares the first calibration signal to a threshold voltage (e.g. the threshold voltage associated with each preamplifier in the preamplifier array 116). The delay multiplexer DM 120 generates the delay signal based on an output of one of the preamplifiers. As explained in connection with FIG. 3, the delay signal 302 includes a first delay signal OUT_M and a second delay signal OUT_P, and corresponds to the output signals of a preamplifier whose threshold voltage is closest to the calibration signal.

At step 404, the delay signal is provided to a backend ADC. The backend ADC includes a first stage of multiple stages. The error count of the first stage is measured by the calibration engine, at step 406. The error count is an absolute difference in a number of ones and zeroes generated by the first stage. The backend ADC 124 includes multiple stages illustrated in FIG. 3 as first stage 310a, a second stage 310b to an nth stage 310n. Each stage includes a delay block, an AND gate and a delay comparator.

The first stage 310a in the backend ADC 124 generates a digital bit in response to the delay signal 302 from the delay multiplexer DM 120. The calibration engine 102 generates multiple input codes; the VD block 106 generates multiple delay signals in response to the multiple input codes; and the first stage 310a in the backend ADC 124 generates multiple digital bits in response to the multiple delay signals. These multiple digital bits generated by the first stage 310a represents a digital code generated by the first stage in response to the multiple input codes generated by the calibration engine 102.

The first stage 310a in the backend ADC 124 generates a digital code in response to the multiple input codes. The digital code from the first stage 310a is provided to the accumulator 316 in the calibration engine 102 through the first multiplexer MUX1 314. The accumulator 316 in the calibration engine 102 measures an error count of the first stage 310a. The error count is the absolute difference in a number of ones and zeroes in the digital code.

At step 408, a delay value of the first stage is stored in the calibration engine for which the error count is minimum. In circuit 100, the calibration engine 102 stores a delay value of the first stage 310a for which the error count of the first stage 310a is minimum. This delay value is the delay value D1 312a of the delay block 304a in the first stage 310a.

The circuit 100 operates in a delay-calibration mode which may be implemented over multiple cycles. For example, with reference to a delay calibration of the first stage 310a, in one cycle, the calibration engine 102 modifies a delay value D1 312a of the delay block 304a in the first stage 310a. The calibration engine 102 generates multiple input codes. The first stage 310a in the backend ADC 124 generates a digital code in response to the multiple input codes. The digital code from the first stage 310a is provided to the accumulator 316 in the calibration engine 102 through the first multiplexer MUX1 314. The accumulator 316 in the calibration engine 102 measures an error count of the first stage 310a. The error count is the absolute difference in a number of ones and zeroes in the digital code.

Based on the error count, the calibration engine 102 modifies the delay value D1 312a of the delay block 304a in a subsequent cycle (e.g. a next cycle). The calibration engine 102 measures the error count generated by the first stage 310a in multiple such cycles. The calibration engine 102 stores a delay value of the first stage 310a for which the error count of the first stage 310a is minimum. This delay value is the delay value D1 312a (or calibrated delay value) of the delay block 304a in the first stage 310a. The delay value D1 312a of the first stage 310a is stored in a memory location (not shown in FIG. 3) specific to the first stage 310a. Thus, the calibration engine 102 provides multiple input codes over multiple cycles, and a delay value of a stage (for example the first stage 310a) is iteratively modified until the delay-calibration mode for that stage is complete. A non-linearity at an output of a stage of backend ADC 124 is caused by a non-linear transfer function of that stage. The delay-calibration calibration mode calibrates the stage to define an optimal gain for that stage across a range defined by multiple input codes. For example, the stored delay value D1 312a of the first stage 310a is used to compensate any non-linearity caused by the non-linear transfer function of the first stage 310a. Hence, the delay calibration mode calibrates the first stage 310a to achieve an optimal gain for the first stage 310a across a range defined by multiple input codes.

Once the first stage 310a is calibrated, the calibration engine 102 calibrates a delay value D2 312b of the delay block 304b in the second stage 310b. This includes multiple cycles as well. In one cycle, the calibration engine 102 modifies the delay value D2 312b of the delay block 304b in the second stage 310b. The calibration engine 102 generates multiple input codes. The second stage 310b generates a digital code in response to the multiple input codes. The accumulator 316 in the calibration engine 102 measures an error count of the second stage 310b. The error count is an absolute difference in a number of ones and zeroes in the digital code. Based on the error count, the calibration engine 102, in the subsequent cycle, modifies the delay value D2 312b of the delay block 304b. The calibration engine 102 measures the error count generated by the second stage 310b in multiple such cycles. The calibration engine 102 stores a delay value of the second stage 310b for which the error count of the second stage 310b is minimum. This delay value is the delay value D2 312b (or calibrated delay value) of the delay block 304b in the second stage 310b. The delay value D2 312b may be stored in a memory location (not shown in FIG. 3) specific to the second stage 310b or in the same memory as the stored delay value D1 312a or in a separate memory.

In the same way, the calibration engine 102 measures an error count of each stage of the multiple stages in the backend ADC 124 across multiple cycles, and also stores a delay value (or calibrated delay value) of each stage of the backend ADC 124. Based on the error count of each stage, the delay value, for each stage is modified by the calibration engine 102 to compensate for non-linearities in the delay of each stage. Thus, the delay calibration mode may be performed iteratively whereby a delay value of a stage is calibrated over one or more cycles followed by calibrating a delay value of a next stage. The delay value for each stage of the multiple stages in the backend ADC 124 are used subsequently during other modes of operation of the circuit 100.

The method enables the circuit 100, in delay-calibration mode, to calibrate and fix a delay value of each delay block in the backend ADC 124. This ensures that the circuit 100 has a minimum gain throughout multiple codes generated by the calibration engine 102. The gain of circuit 100 is affected by delay value (which, for example, is subject to irregularities and non-linearities based on semiconductor manufacturing variations and temperature-dependent factors) of each stage in the backend ADC 124, and the method through the delay-calibration mode ensures that the delay value of each stage is calibrated optimally for the circuit 100 to operate as a high-speed ADC. The delay-calibration mode allows circuit 100 to act as a linear ADC as delays of each stage in the backend ADC 124 is calibrated to achieve optimal gain across a range defined by multiple input codes.

Hence, the method provides that the circuit 100 does not require any complex algorithms or hardware for digital conversion of the input voltage Vin 110. Thus, the method of some example embodiments ensures that the circuit 100 is capable of being used in RF sampling receivers which operate at speeds of GSPS. The circuit 100 scales well with technology nodes and is capable of supporting high GSPS transfer rates in future technology nodes.

Figure 5:
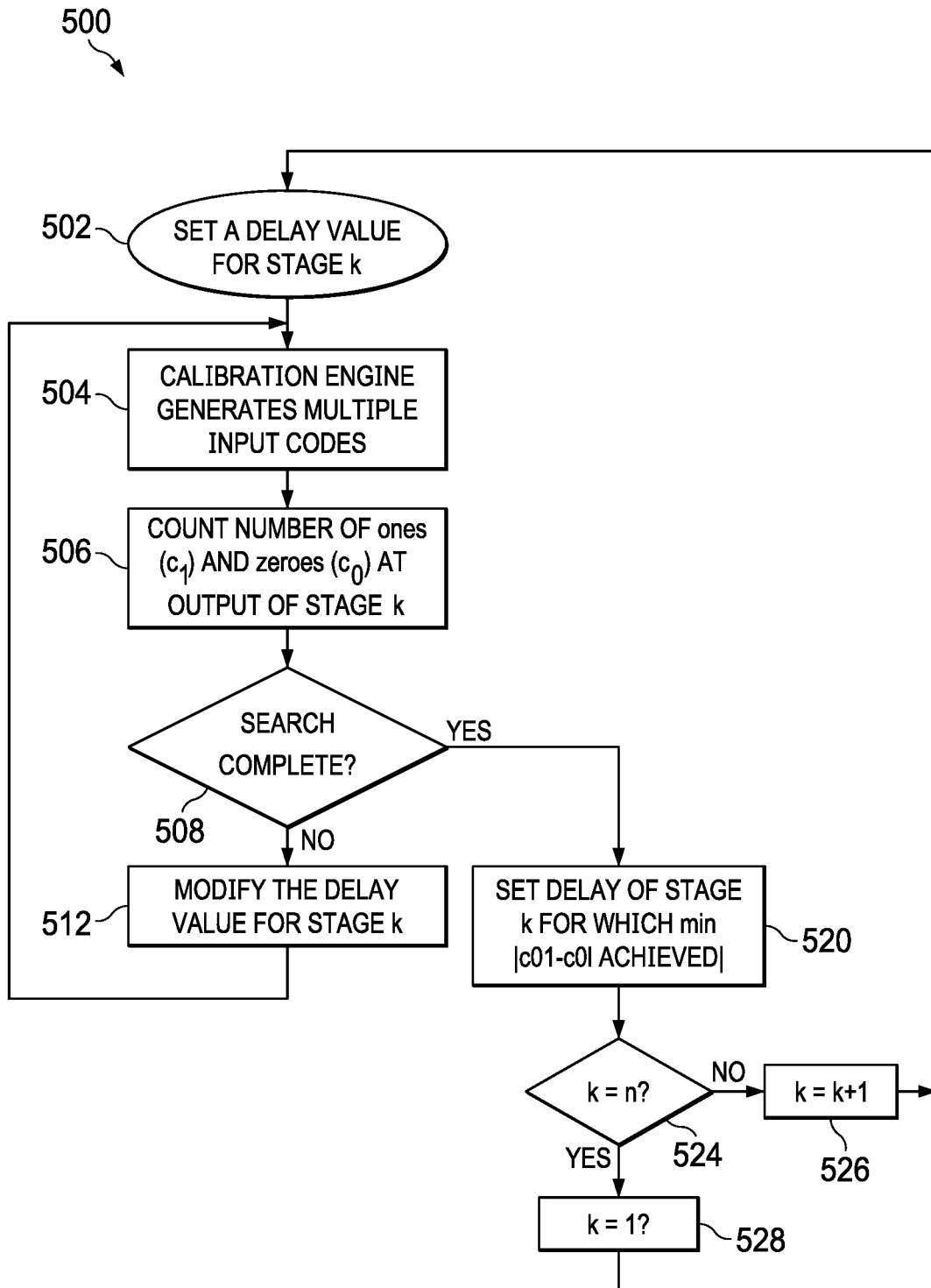
FIG. 5 is a flowchart of a method of operation of a circuit, according to an example embodiment.

FIG. 5 is a flowchart 500 of a method of operation of a circuit, according to an example embodiment. The flowchart 500 is described in connection with the circuit 100 of FIG. 1 and/or its components illustrated in FIG. 2 and FIG. 3. The flowchart 500 illustrates calibrating multiple stages 310a, 310b to 310n using the delay calibration mode which, for example, includes multiple cycles. At step 502, a delay value of stage k is set. In circuit 100, for example, the backend ADC 124 includes multiple stages illustrated in FIG. 3 as first stage 310a, a second stage 310b to an nth stage 310n. Each stage includes a delay block, an AND gate and a delay comparator. The calibration engine 102 sets a delay value D1 312a of the delay block 304a in the first stage 310a.

At step 504, a calibration engine generates multiple input codes. For example, in circuit 100, the calibration engine 102 generates multiple input codes. The first stage 310a (or stage k) in the backend ADC 124 generates a digital code in response to the multiple input codes. The digital code from the first stage 310a (or stage k) is provided to the accumulator 316 in the calibration engine 102. At step 506, a number of ones (c1) and zeroes (c0) at output of stage k is counted. An absolute error count (E) is measured from a difference in the number of ones (c1) and zeroes (c0).

$$E=|c1-c0| \qquad (1)$$

The accumulator 316 in the calibration engine 102 measures an error count of the first stage 310a (or stage k). The error count is an absolute difference in a number of ones and zeroes in the digital code generated by the first stage 310a (or stage k). At step 508, it is determined if search (calibration of stage k) is complete. The search (or calibration of stage k) is considered complete when the error count at the output of stage k has been obtained for all the input codes. In one version, search is considered complete when there is a change in sign of the error count (E) for stage k. In another example embodiment, search is considered complete when a minimum absolute value of error count (E) is achieved. If the search (calibration of stage k) is complete, the method proceeds to step 512 else the method proceeds to step 520.

At step 512, the delay value for stage k is modified. The delay value is modified based on the error count (E) (or relative counts of ones and zeroes) for that stage. If the error count (E) is greater than zero, the delay value of the stage k is incremented and if the error count (E) is less than zero, the delay value of the stage k is decremented. In circuit 100, for example, based on the error count (or counts of ones and zeroes), the calibration engine 102, modifies the delay value D1 312a of the delay block 304a in the first stage 310a. In one version, if the error count is greater than a threshold, the delay value of the delay block 304a is incremented, and if the error count is lesser than a threshold, the delay value of the delay block 304a is decremented.

Steps 504 to 512 are repeated until the search (or delay calibration) is complete for stage k. In one version, steps 504 to 512 are repeated until there is a change in sign of the error count (E) for stage k. In another example embodiment, steps 504 to 512 are repeated until a minimum absolute value of error count (E) is achieved. In circuit 100 as well, the delay calibration mode may include multiple cycles. In one example, the delay calibration starts from the first stage 310a (k=1), at step 502. In each cycle of step 504 to 512, the calibration engine 102 iteratively modifies the delay value D1 312a of the delay block 304a. The calibration engine 102 measures the error count generated by the first stage 310a in multiple such cycles.

At step 520, the delay of stage k is fixed for which minimum absolute value of the error count (E) is achieved. In circuit 100, the calibration engine 102 stores a delay value of the first stage 310a for which the absolute value of error count of the first stage 310a is minimum. This delay value is the delay value D1 312a of the delay block 304a in the first stage 310a. At step 524, in a system having n stages where n is the last stage, the method compares if k is equal to n. At step 526, if the method has not reached the last stage, k is incremented by one, in one example. In another example, k is incremented by an integer greater than 1. Thereafter, all the steps illustrated in flowchart 500 are repeated for stage k+1.

At step 528, if the method has reached the last stage (n), the system resets and the steps illustrated in flowchart 500 are repeated from first stage to nth stage. Similarly, in circuit 100, the calibration engine 102 measures an error count of each stage of the multiple stages in the backend ADC 124 across multiple cycles, and also stores a delay value of each stage of the backend ADC 124. The delay value for each stage of the multiple stages in the backend ADC 124 are used subsequently during other modes of operation of the circuit 100. In some example embodiments, step 528 is optional.

The method illustrated by flowchart 500 enables the circuit 100, in delay-calibration mode, to calibrate and compensate for a delay value of each delay block in the backend ADC 124. This ensures that the circuit 100 has a minimum gain throughout multiple codes generated by the calibration engine 102. The gain of circuit 100 is affected by delay value of each stage in the backend ADC 124, and the method through the delay-calibration mode ensures that the delay value of each stage is calibrated optimally for the circuit 100 to operate as a high-speed ADC. The method allows circuit 100 to act as a linear ADC as delays of each stage in the backend ADC 124 is calibrated to achieve optimal gain across a range defined by multiple input codes.

Hence, the method provides that the circuit 100 does not require any complex algorithms or hardware for digital conversion of the input voltage Vin 110. This reduces the area and power requirements of the circuit 100. Thus, the method ensures that the circuit 100 is capable of being used in RF sampling receivers which operate at speeds of GSPS. The circuit 100 scales well with technology nodes and is capable of supporting high GSPS transfer rates in future technology nodes.

Figure 6:
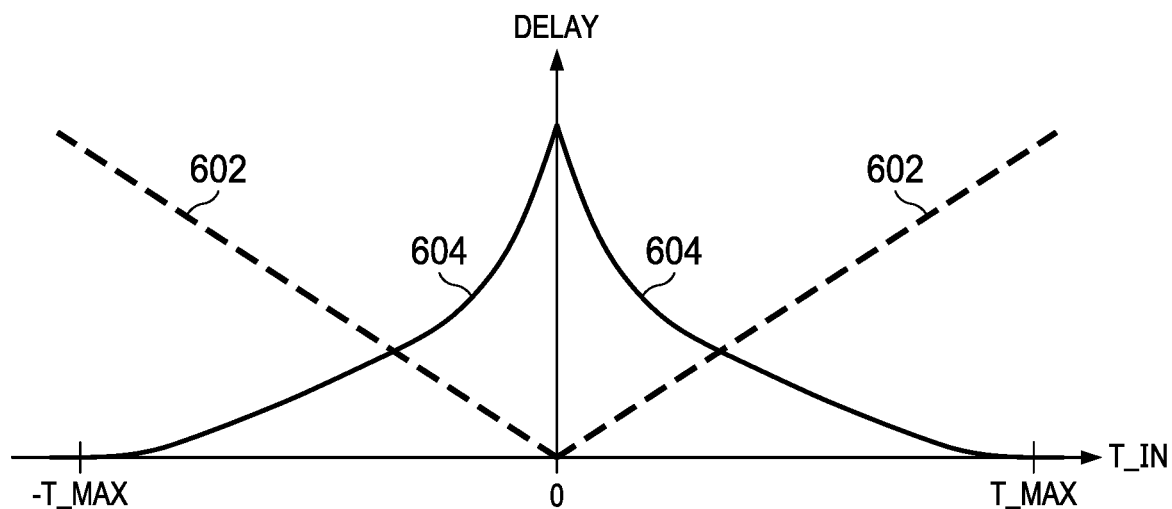
FIG. 6 is a graph which illustrates AND-gate delay and comparator delay generated by an AND gate and a delay comparator, respectively, in a stage of a backend ADC, according to an example embodiment.

FIG. 6 is a graph which illustrates AND-gate delay and comparator delay generated by an AND gate and a delay comparator, respectively, in a stage of a backend ADC, according to an example embodiment. The graph is explained in connection with the backend ADC 124 illustrated in FIG. 3. The graph includes an X-axis (T_IN) and a Y-axis (Output Delay). The AND-gate (for example the AND gates 306a, 306b to 306n) delay and the comparator (for example the delay comparators 308a, 308b to 308n) delay are functions of input-signal delay, according to an example embodiment. The input-signal delay is delay between the signals received by the AND gate or by the delay comparator. As illustrated, the AND-gate delay 602 contributed by a respective AND gate is linearly related to the absolute value of an input-signal delay T_IN, where the input-signal delay T_IN is the difference in timing between signals AN and BN input into the respective AND gate, where N is an integer and N is equal to 1 for the first stage 310a and N is equal to 2 for second stage 310b. In the illustrated configuration, the relationship of the AND gate delay 602 to the input-signal delay T_IN is linear regardless of whether AN or BN leads or follows.

Signals AN and BN are also applied to the inputs of the delay comparators, causing the delay comparators to generate corresponding signal BN'. For each one of the delay comparators (for example 308a and 308b), the timing of the leading edge of signal BN' tracks the timing of the leading edge of the earlier-arriving of signals AN and BN. In particular, for each one of the delay comparators, the timing of the leading edge of signal BN' is equal to (1) the timing of the leading edge of the earlier-arriving of signals AN and BN plus (2) a comparator delay 604 that is logarithmically inversely related to the absolute value of the input-signal delay T_IN (in other words, comparator delay is greater for input values that are more similar, and if the difference between the two inputs to the comparator is greater, the comparator delay is less).

Figure 7:
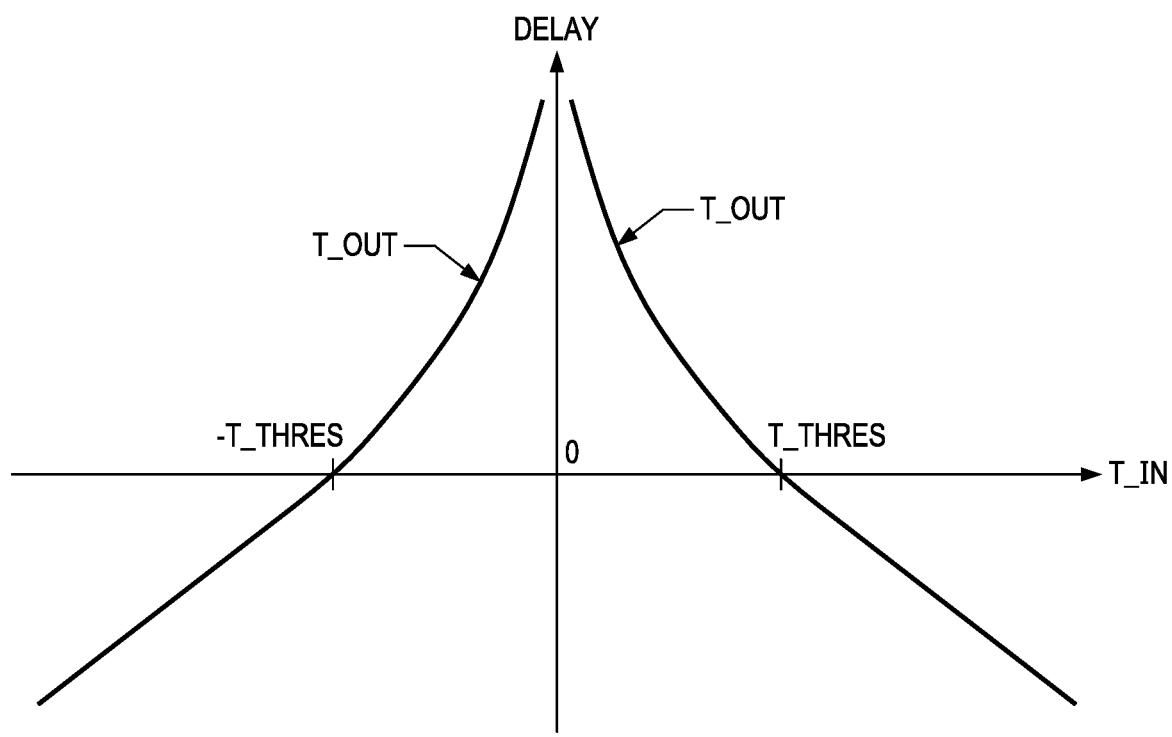
FIG. 7 is a graph which illustrates output-signal delay of a stage as a function of the input-signal delay of the stage of a backend ADC, according to an example embodiment.

FIG. 7 is a graph which illustrates output-signal delay of a stage as a function of the input-signal delay of the stage of a backend ADC, according to an example embodiment. Subtracting the AND gate-delay 602 from the comparator delay 604 yields the output-signal delay T_OUT for any given single-bit stage for example, the first stage 310a. When the absolute value of the input-signal delay T_IN is less than a threshold delay T_THRES, then the output-signal delay T_OUT is a positive value (meaning that the leading edge of signal BN' generated by the respective delay comparator lags the leading edge of signal AN' generated by the respective AND gate. On the other hand, when the absolute value of the input-signal delay T_IN is greater than the threshold delay T_THRES, then the output-signal delay T_OUT is a negative value (meaning that the leading edge of signal AN' leads the leading edge of corresponding signal BN'). The positive or negative character of the output-signal delay T_OUT is reported to the calibration engine 102.

In operation, the delay comparator 308a issues a first sign signal ("1" or "0") to the calibration engine 102. The first sign signal (an example of a digital signal in accordance with this disclosure) is based on which one of the leading edges of signals A1 and B1 is first received by the delay comparator 308a, such that the first sign signal reflects the order of the leading edges of signals A1 and B1 applied to the delay comparator 308a. The AND gate 306a and the delay comparator 308a generate signals A1' and B1' which are applied to the second stage 310b. The delay comparator 308b outputs a second sign signal ("1" or "0") to the calibration engine 102. The second sign signal is based on which one of the leading edges of the signals A2 and B2 is first received by the delay comparator 308b, such that the second sign signal reflects the order of the leading edges of the signals A2 and B2 applied to the delay comparator 308b.

Since the delay between signals A1 and B1 can be predicted as a function of the input voltage Vin 110, and vice versa, and since the delay between the signals AN' and BN' output by a successive stage can be predicted as a function of the signals AN and BN received from the preceding stage, and vice versa, the sign signals output by the delay comparators of the cascade of stages can be predicted as a function of the input voltage Vin 110, and vice versa. Therefore, a code made up of the sign signals may be reliably compared to a predetermined correlation to determine an approximation of the input voltage Vin 110. In operation, the timings of the signals A1 and B1 are functionally (that is, predictably) related to the timings of the signals OUT_P and OUT_M whose timing is correlated to the input voltage Vin 110, as discussed above. The timings of the signals A1' and B1' are functionally (that is, predictably) related to the timings of the signals A1 and B1, and so on. Thus, since the timings of the signals OUT_P and OUT_M are functionally (that is, predictably) related to the input voltage Vin 110, the timings of the signals on lines A1, B1, A1', B1', and so on, which determine the sign signals used to make up the output code, are also functionally related to the input voltage Vin 110.

Figure 8A:
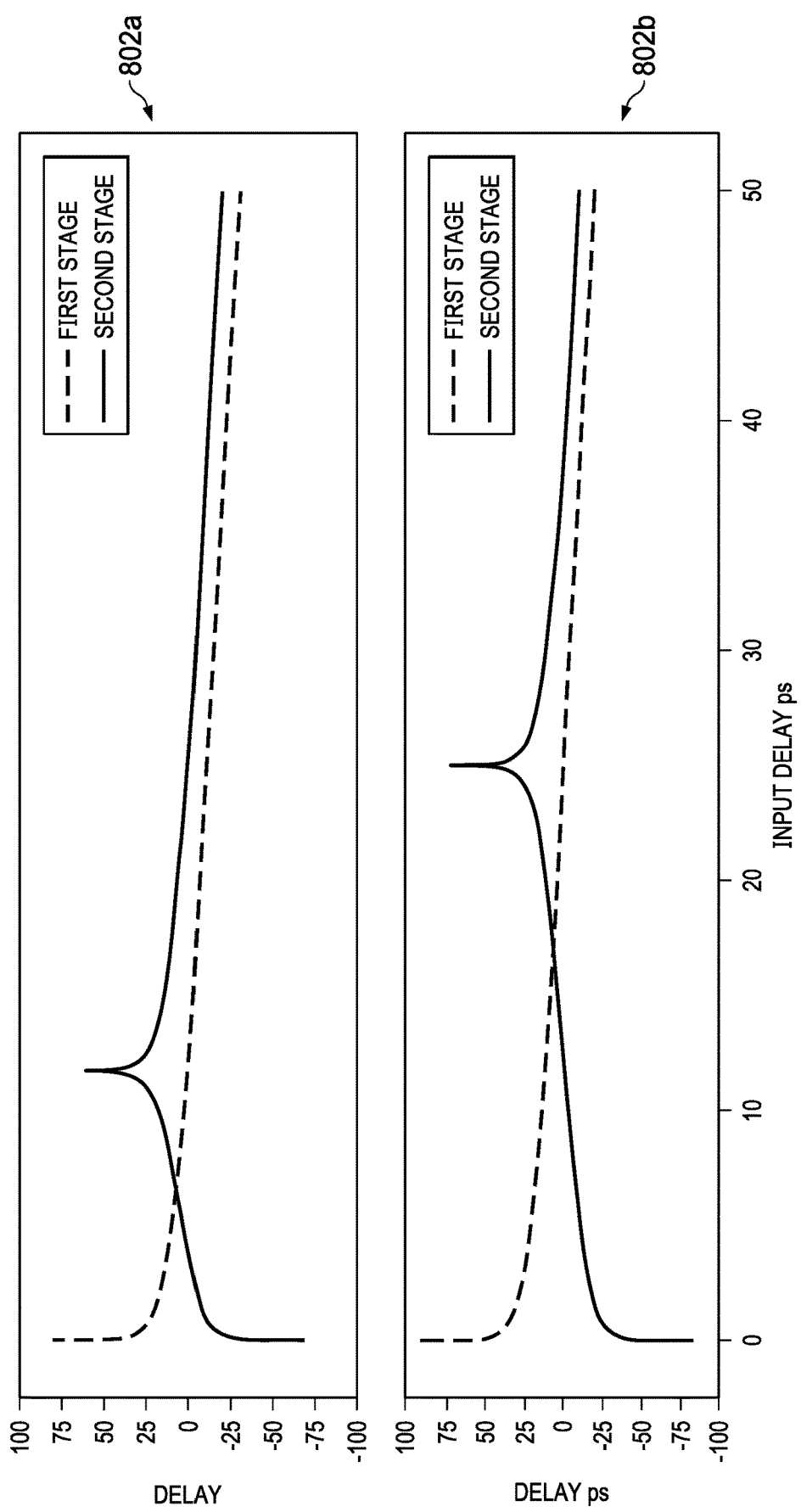
FIGS. 8A and 8B. are graphs which illustrates output-signal delay of different stages as a function of the input-signal delay of a backend ADC, according to an example embodiment.
Figure 8B:
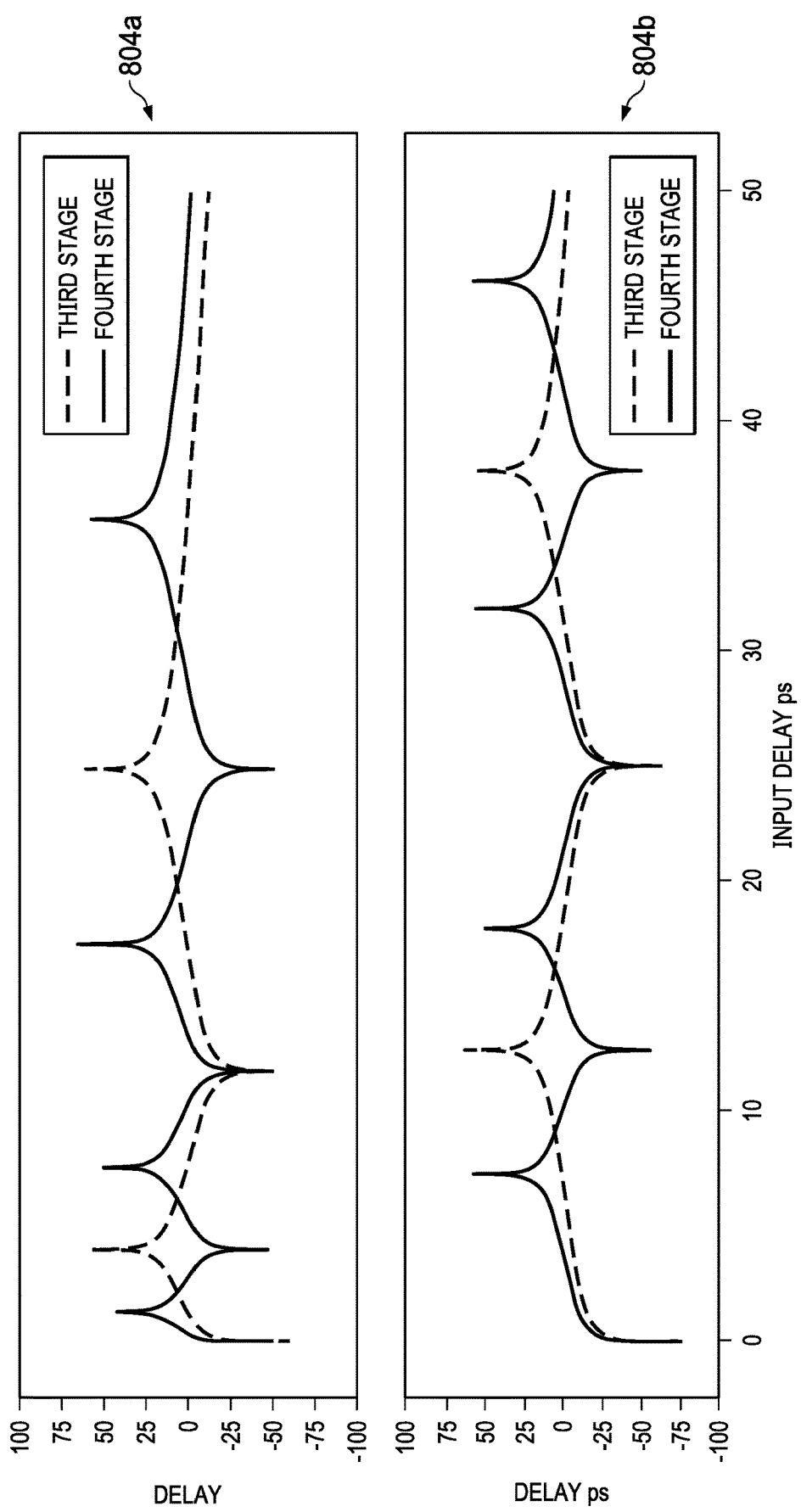

FIGS. 8A and 8B are graphs which illustrates output-signal delay of different stages as a function of the input-signal delay of a backend ADC, according to an example embodiment. As discussed in connection with FIG. 7, subtracting the AND gate-delay 602 from the comparator delay 604 yields the output-signal delay T_OUT for any given single-bit stage for example, the first stage 310a. When the absolute value of the input-signal delay T_IN is less than a threshold delay T_THRES, then the output-signal delay T_OUT is a positive value (meaning that the leading edge of signal BN' generated by the respective delay comparator lags the leading edge of signal AN' generated by the respective AND gate. On the other hand, when the absolute value of the input-signal delay T_IN is greater than the threshold delay T_THRES, then the output-signal delay T_OUT is a negative value (meaning that the leading edge of signal AN' leads the leading edge of corresponding signal BN').

Graph 802a represents an output signal delay for a first and a second stage in a traditional circuit. Graph 802b represents an output signal delay for the first stage 310a and the second stage 310b of circuit 100. Graph 804a represents an output signal delay for a third and a fourth stage in a traditional circuit. Graph 804b represents an output signal delay for the third stage 310c and a fourth stage 310d of circuit 100. Thus, from graph 802a, gain profile of second stage is asymmetric, higher gain at toggling point and lower gain at extreme points. In addition, if correction is performed to correct the asymmetric nature of second stage, it results in error during calibration of subsequent stages. Also, calibration of second stage at toggling points of third stage results in error during calibration of subsequent stages. However, circuit 100 is able to address all these challenges. As represented by graph 802b, the circuit 100 provides a symmetric gain profile for second stage 310b. The circuit 100 uses a delay calibration mode which ensures delay value of each stage in the backend ADC 124 is calibrated. Similarly, graph 804b illustrates that the circuit 100 provides a symmetric gain profile for the third stage 310c and the fourth stage 310d.

The calibration engine 102 measures an error count of each stage of the multiple stages in the backend ADC 124 across multiple cycles, and also stores a delay value of each stage of the backend ADC 124. The error count is an absolute difference in a number of ones and zeroes in the digital code generated by a stage. The delay value (or calibrated delay value) for each stage of the multiple stages in the backend ADC 124 are used subsequently during other modes of operation of the circuit 100. These delay values (or calibrated delay values) of each stage distribute asymmetricity across the range of input codes making gain uniform. Thus, as illustrated by graphs 802b and 804b, the delay-calibration mode ensures that the delay value of each stage is calibrated optimally for the circuit 100 to operate as a high-speed ADC. The calibration mode ensures better standard deviation resulting in more uniform gain across regions. Also, circuit 100 provides for averaging in each stage during delay calibration which makes it more robust to noise.

Figure 9:
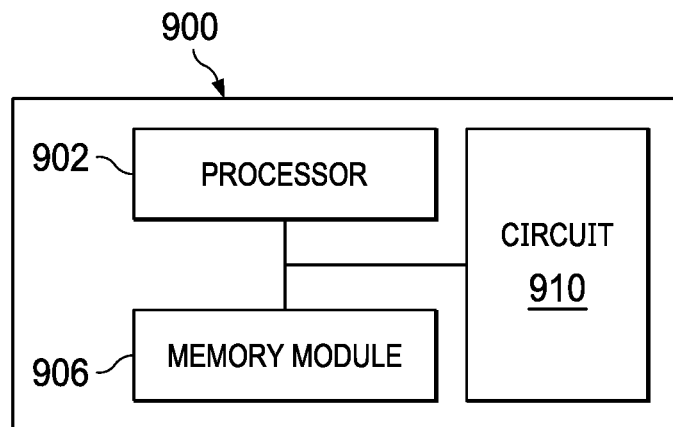
FIG. 9 is a block diagram of an example device 900 in which several aspects of example embodiments can be implemented.

FIG. 9 is a block diagram of an example device 900 in which several aspects of example embodiments can be implemented. The device 900 is, or is incorporated into or is part of, a server farm, a vehicle, a communication device, a transceiver, a personal computer, a gaming platform, a computing device, or any other type of electronic system. The device 900 may include one or more conventional components that are not described herein for simplicity of the description.

In one example, the device 900 includes a processor 902 and a memory 906. The processor 902 can be a CISC-type (complex instruction set computer) CPU, RISC-type CPU (reduced instruction set computer), a digital signal processor (DSP), a processor, a CPLD (complex programmable logic device) or an FPGA (field programmable gate array).

The memory 906 (which can be memory such as RAM, flash memory, or disk storage) stores one or more software applications (e.g., embedded applications) that, when executed by the processor 902, performs any suitable function associated with the device 900.

The processor 902 may include memory and logic, which store information frequently accessed from the memory 906. The device 900 includes a circuit 910. In one example, the processor 902 may be placed on the same printed circuit board (PCB) or card as the circuit 910. In another example, the processor 902 is external to the device 900. The circuit 910 can function as an analog to digital converter.

The circuit 910 is similar, in connection and operation, to the circuit 100 of FIG. 1. The circuit 910 includes a calibration engine (for example, calibration engine 102), a digital to analog converter (DAC) (e.g. DAC 104), a multiplexer (e.g. multiplexer M 112), a voltage to delay (VD) block (e.g. VD block 106), a backend analog to digital converter (ADC) (e.g. backend ADC 124) and a storage circuit (e.g. storage circuit 108). The VD block includes a preamplifier array (e.g. preamplifier array 116) and a delay multiplexer DM (e.g. delay multiplexer DM 120). The multiplexer receives an input voltage Vin. The preamplifier array includes multiple preamplifiers (e.g. as illustrated in FIG. 2).

The VD block perform a voltage-to-delay function. The backend ADC perform a delay-to-digital function. Similar to the description above, the circuit 910 operates in a delay-calibration mode, a memory-calibration mode and a mission mode.

The term "couple" is used throughout. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described embodiments, and other embodiments are possible, within the scope of the claims.

What is claimed is:

1. An analog to digital converter (ADC) comprising:
a first ADC having a first stage including a first delay block; and
a first circuit coupled to the first ADC and configured to generate a plurality of input codes; wherein
the first delay block is configured to generate a digital code in response to the plurality of input codes, and the first circuit is configured to determine an error count responsive to the digital code and configured to modify a delay value of the first delay block based on the error count.

2. The ADC of claim 1, wherein the first ADC includes a plurality of stages including the first stage, and each stage of the plurality of stages further comprises:
a delay block coupled to the first circuit;
a logic gate coupled to the delay block; and
a delay comparator coupled to the delay block and the first circuit.

3. The ADC of claim 1 further comprising:
a DAC (digital to analog converter) coupled to the first circuit, the DAC configured to generate a calibration signal in response to an input code of the plurality of input codes;
a multiplexer coupled to the DAC, and configured to receive an input voltage and the calibration signal;
a voltage to delay (VD) block coupled to the multiplexer; and
a storage circuit coupled to the first ADC.

4. The ADC of claim 3 configured to operate in a delay-calibration mode, a memory-calibration mode, and a mission mode, wherein the delay-calibration mode includes a plurality of cycles, and in a cycle of the plurality of cycles:

the first circuit is configured to modify the delay value of the first delay block in the first stage;

the first circuit is configured to generate the plurality of input codes;

the VD block is configured to generate a plurality of delay signals in response to the plurality of input codes;

the first stage is configured to generate the digital code in response to the plurality of delay signals; and the first circuit is configured to determine the error count responsive to the digital code, in which the error count is an absolute difference in a number of ones and zeroes in the digital code.

5. The ADC of claim 4, wherein the delay value for which the error count of the first delay block is minimum is stored as the delay value of the first delay block.

6. The ADC of claim 5 further comprising a second stage in the first ADC, the second stage is coupled to the first stage, and configured to receive an output of the first stage, wherein in the delay-calibration mode:

the first circuit is configured to modify a delay value of a second delay block in the second stage;

the first circuit is configured to generate the plurality of input codes;

the VD block is configured to generate the plurality of delay signals in response to the plurality of input codes;

the second stage is configured to generate a digital code in response to the plurality of delay signals; and the first circuit is configured to determine the error count responsive to the digital code, in which the error count is the absolute difference in a number of ones and zeroes in the digital code.

7. The ADC of claim 6, wherein the delay value for which the error count of the second delay block is minimum is stored as the delay value of the second delay block.

8. The ADC of claim 4, wherein in the memory-calibration mode:

the first circuit is configured to generate a plurality of input codes;

the DAC is configured to generate a calibration signal in response to an input code of the plurality of input codes;

the VD block is configured to generate a delay signal responsive to the calibration signal;

the first ADC is configured to generate an output code responsive to the delay signal; and the storage circuit is configured to store the input code at an address corresponding to the output code.

9. The ADC of claim 4, wherein the VD block further comprising:

one or more preamplifiers, each preamplifier configured to compare one of the input voltage and the calibration signal to a threshold voltage; and a delay multiplexer coupled to the one or more preamplifiers, and configured to generate a delay signal based on an output of one of the preamplifiers.

10. The ADC of claim 4, wherein in the mission mode:

the VD block is configured to generate a delay signal in response to an input voltage; and the first ADC is configured to generate a raw code in response to the delay signal, wherein the input code stored at an address corresponding to the raw code is generated as a final output.

11. A method of operating an analog to digital converter (ADC) comprising:

generating a plurality of input codes by a first circuit;

generating a digital code by a first delay block in response to the plurality of input codes;

determining an error count responsive to the digital code; and modifying a delay value of the first delay block based on the error count.

12. The method of claim 11 further comprising:

generating a calibration signal in response to an input code of the plurality of input codes;

generating a delay signal responsive to the calibration signal; and providing the delay signal to a first ADC, the first ADC having a plurality of stages including a first stage, the first stage having the first delay block.

13. The method of claim 12 further comprising operating the ADC in a delay-calibration mode, a memory-calibration mode, and a mission mode, wherein the delay-calibration mode includes a plurality of cycles, and in a cycle of the plurality of cycles:

modifying the delay value of the first delay block in the first stage;

generating the plurality of input codes by the first circuit;

generating a plurality of delay signals in response to the plurality of input codes;

generating the digital code by the first delay block in response to the plurality of delay signals; and determining the error count responsive to the digital code, in which the error count is an absolute difference in a number of ones and zeroes in the digital code.

14. The method of claim 13 further comprising storing the delay value for which the error count is minimum as the delay value of the first delay block in the first stage.

15. The method of claim 13 further comprising providing an output of the first stage to a second stage, wherein in the delay-calibration mode:

modifying a delay value of a second delay block in the second stage;

generating the plurality of input codes by the first circuit;

generating the plurality of delay signals in response to the plurality of input codes;

generating a digital code by the second delay block in response to the plurality of delay signals; and determining the error count responsive to the digital code, in which the error count is the absolute difference in a number of ones and zeroes in the digital code.

16. The method of claim 15 further comprising storing the delay value for which the error count is minimum as the delay value of the second delay block in the second stage.

17. The method of claim 13, wherein in the memory-calibration mode:

generating a plurality of input codes by the first circuit;

generating a calibration signal in response to an input code of the plurality of input codes;

generating a delay signal responsive to the calibration signal;

generating an output code responsive to the delay signal; and storing the input code at an address corresponding to the output code.

18. The method of claim 13, wherein in the mission mode:

generating a delay signal in response to an input voltage; and generating a raw code by the first ADC in response to the delay signal, wherein the input code stored at an address corresponding to the raw code is generated as a final output.

19. An analog to digital converter (ADC) comprising:

a first ADC having a plurality of stages, each stage further having a delay block, a logic gate and a delay comparator;

a first circuit coupled to the first ADC, the first circuit having:

a multiplexer coupled to each delay comparator in the plurality of stages; and an accumulator coupled to the multiplexer.

20. The ADC of claim 19 further comprising:

a DAC (digital to analog converter) coupled to the first circuit;

a second multiplexer coupled to the DAC, and configured to receive an input voltage;

a voltage to delay (VD) block coupled to the second multiplexer; and a storage circuit coupled to the first ADC.

21. An analog to digital converter (ADC) comprising:

a first ADC having a plurality of stages, each stage further having a delay block, a logic gate and a delay comparator; and a first circuit coupled to the first ADC, the first circuit configured to generate a plurality of input codes, wherein each stage is configured to generate a digital code in response to the plurality of input codes, and the first circuit is configured to modify a delay value of one or more delay blocks based on the digital code.

22. The ADC of claim 21 further comprising:

a DAC (digital to analog converter) coupled to the first circuit, the DAC configured to generate a calibration signal in response to an input code of the plurality of input codes;

a multiplexer coupled to the DAC, and configured to receive an input voltage and the calibration signal;

a voltage to delay (VD) block coupled between the multiplexer and the first ADC; and a storage circuit coupled to the first ADC.

\* \* \* \* \*